(12) United States Patent
Su et al.

(10) Patent No.: US 8,405,941 B2
(45) Date of Patent: Mar. 26, 2013

(54) ESD PROTECTION APPARATUS AND ESD DEVICE THEREIN

(75) Inventors: Yu-Ti Su, Tainan County (TW); Chung-Ti Hsu, Taipei (TW)

(73) Assignee: Nuvoton Technology Corporation, Hsinchu (TW)

( * ) Notice: Subject to any disclaimer, the term of this patent is extended or adjusted under 35 U.S.C. 154(b) by 72 days.

(21) Appl. No.: 12/628,188

(22) Filed: Nov. 30, 2009

(65) Prior Publication Data

US 2011/0128658 A1   Jun. 2, 2011

(51) Int. Cl.
*H02H 9/00* (2006.01)
*H02H 3/22* (2006.01)

(52) U.S. Cl. ............................. 361/56; 361/111
(58) Field of Classification Search ............ 361/56, 361/111
See application file for complete search history.

(56) References Cited

U.S. PATENT DOCUMENTS

| | | | |
|---|---|---|---|
| 6,459,127 B1 | 10/2002 | Lee et al. | |
| 6,614,077 B2 | 9/2003 | Nakamura et al. | |
| 7,098,522 B2 * | 8/2006 | Lin et al. | 257/500 |
| 7,129,546 B2 * | 10/2006 | Ker et al. | 257/360 |
| 2003/0043523 A1 * | 3/2003 | Hung et al. | 361/111 |
| 2008/0218922 A1 * | 9/2008 | Mallikararjunaswamy et al. | 361/91.6 |

FOREIGN PATENT DOCUMENTS

| | | |
|---|---|---|
| CN | 1236485 A | 11/1999 |
| CN | 1681122 A | 10/2005 |
| CN | 1851923 A | 10/2006 |

OTHER PUBLICATIONS

Snapback Breakdown Dynamics and ESD Susceptibility of LDMOS IEEE Int. Reliab.Phys. Symp., 2006, pp. 352-355.
ESD Protection for High-Voltage CMOS Technologies EOS/ESD Sym., 2006, pp. 77-86.
A No-Snapback LDMOSFET With Automotive ESD Endurance Kazunori K., etc. Electron Devices, IEEE Transactions on vol. 49, Issue 11, Nov. 2002 pp. 2047-2053.
High Voltage ESD Protection Devices Design in BCD Process MBA thesis by NCTU Yeh-Jen Huang/ A Thesis Submitted to College of Electrical and Computer Engineering National Chiao Tung University in Partial Fulfillment of the Requirements for the Degree of Master in Industrial Technology R & D Master Proram on Microelectronics and Nano Sciences / Jan. 2008.
Novel ESD Protection Structure with Embedded SCR LDMOS for Smart Power Technology IEEE Int. Reliab. Phys. Symp., 2002, pp. 156-161(TSMC).
ESD protection solutions for high voltage technologies Microelectronics Reliability 46 (2006) 677-688.

\* cited by examiner

*Primary Examiner* — Stephen W Jackson
*Assistant Examiner* — Lucy Thomas
(74) *Attorney, Agent, or Firm* — CKC & Partners Co., Ltd.

(57) ABSTRACT

An electrostatic discharge (ESD) protection device is provided. The ESD protection device includes a source region and a drain region. The source region is to be coupled to a low-level voltage. The drain region is disposed apart from the source region and includes a first P-type heavily doped region and at least one first N-type heavily doped region. The first P-type heavily doped region is configured to couple to a pad, and the first N-type heavily doped region is adjacent to the first P-type heavily doped region and floated. An electrostatic discharge protection apparatus is also disclosed herein.

15 Claims, 7 Drawing Sheets

ESD PROTECTION APPARATUS AND ESD DEVICE THEREIN

BACKGROUND

1. Technical Field

The present disclosure relates to an electronic apparatus. More particularly, the present disclosure relates to an electrostatic discharge (ESD) protection apparatus.

2. Description of Related Art

Conventionally, there is an electrostatic discharge (ESD) protection mechanism set in every kind of electronic apparatus, so as to prevent the electronic apparatus from damaging due to a momentary large current when a human body carrying too many electrostatic charges touches the electronic apparatus, or to prevent the electronic apparatus from being affected by electrostatic charges existing in the environment or carried by transportation to abnormally operate.

However, electronic apparatus usually needs a higher voltage to trigger the ESD protection mechanism therein, and secondary breakdown current of the ESD protection mechanism is generally not large enough, such that the ESD protection mechanism cannot effectively protect the electronic apparatus.

SUMMARY

In accordance with one embodiment of the present invention, an electrostatic discharge (ESD) protection device is provided. The ESD protection device includes a source region and a drain region. The source region is to be coupled to a low-level voltage. The drain region is disposed apart from the source region and includes a first P-type heavily doped region and at least one first N-type heavily doped region. The first P-type heavily doped region is configured to couple to a pad, and the first N-type heavily doped region is adjacent to the first P-type heavily doped region and floated.

In accordance with another embodiment of the present invention, an electrostatic discharge (ESD) protection apparatus is provided. The ESD protection apparatus includes a phase shift circuit, a transistor switch circuit and a first metal-oxide-semiconductor field effect transistor (MOSFET). The phase shift circuit has a transient response and generates a response voltage according to the transient response when receiving electrostatic discharge charges. The transistor switch circuit is triggered by the response voltage to turn on and generates a control voltage based on the electrostatic discharge charges. The first MOSFET turns on according to the control voltage and has a parasitical silicon controlled rectifier (SCR) equivalent circuit, in which the electrostatic discharge charges are discharged through the SCR equivalent circuit when the first MOSFET is turned on by the control voltage. The first MOSFET further includes a P-type heavily doped region and at least one N-type heavily doped region. The P-type heavily doped region is configured to couple to a pad and to be an anode of the SCR equivalent circuit. The N-type heavily doped region is adjacent to the P-type heavily doped region and floated.

In accordance with yet another embodiment of the present invention, an electrostatic discharge (ESD) protection apparatus is provided. The ESD protection apparatus includes a first metal-oxide-semiconductor field effect transistor (MOSFET), a first equivalent resistor, a transistor switch, a second equivalent resistor and an equivalent capacitor. The first MOSFET is coupled between a pad and a low-level voltage and has a parasitic silicon controlled rectifier (SCR) equivalent circuit. The first MOSFET includes a P-type heavily doped region and at least one N-type heavily doped region, in which the first MOSFET is coupled through the P-type heavily doped region to the pad, the P-type heavily doped region is an anode of the SCR equivalent circuit, and the N-type heavily doped region is adjacent to the P-type heavily doped region and floated.

The first equivalent resistor is coupled between a gate of the first MOSFET and the low-level voltage. The transistor switch is coupled between the pad and the first equivalent resistor and is configured to conduct currents between the pad and the first equivalent resistor. The second equivalent resistor is coupled between the pad and a control terminal of the transistor switch. The equivalent capacitor is coupled between the control terminal of the transistor switch and the low-level voltage. When electrostatic discharge charges occurs on the pad, the transistor switch conducts currents between the pad and the first equivalent resistor, such that the first MOSFET turns on and the electrostatic discharge charges are discharged through the SCR equivalent circuit.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the disclosure is capable of modification in various respects, all without departing from the disclosure. Accordingly, the drawings and description are to be regarded as illustrative in nature, and not restrictive.

Figure 1:
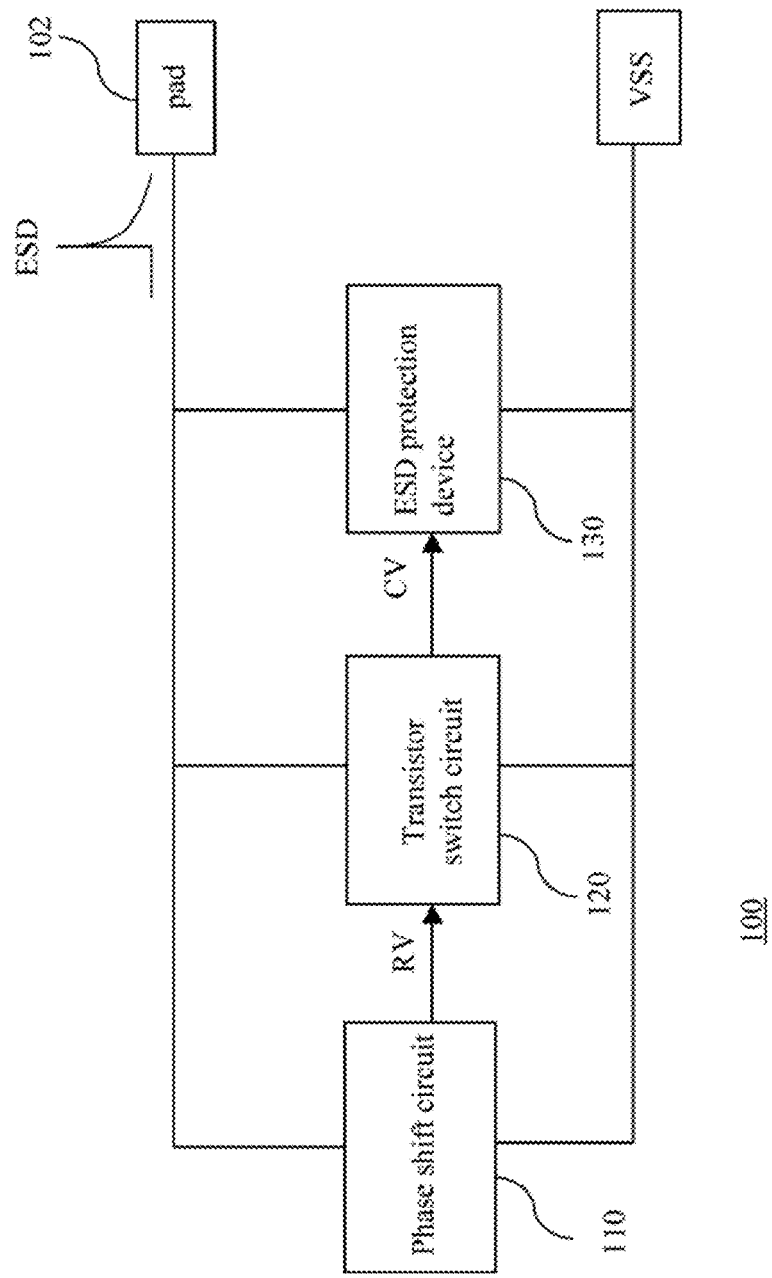
FIG. 1 is a block diagram of an electrostatic discharge protection apparatus in accordance with one embodiment of the present invention.

FIG. 1 is a block diagram of an electrostatic discharge protection apparatus in accordance with one embodiment of the present invention. The electrostatic discharge (ESD) protection apparatus 100 includes a phase shift circuit 110, a transistor switch circuit 120 and an ESD protection device 130, in which the phase shift circuit 110, the transistor switch circuit 120 and the ESD protection device 130 are all coupled between a pad 102 and a low-level voltage VSS (e.g. ground voltage), and the ESD protection device 130 has a parasitical silicon controlled rectifier (SCR) equivalent circuit (not shown). The SCR equivalent circuit is an electronic device with semiconductor interfaces of P/N/P/N.

The ESD protection device 130 can be a transistor. More specifically, the ESD protection device 130 can be a lateral diffusion metal-oxide-semiconductor field effect transistor (LDMOS) or a high voltage metal-oxide-semiconductor field effect transistor (HVMOS).

In operation, when the pad 102 suddenly has electrostatic discharge charges (hereinafter referred to as ESD charges) or has a large voltage or large current surge due to the ESD charges, the phase shift circuit 110 activates the transistor switch circuit 120, and then the transistor switch circuit 120 controls the ESD protection device 130 to turn on, such that the surge or ESD charges are discharged through the parasitical SCR equivalent circuit in the ESD protection device 130.

Specifically, the phase shift circuit 110 has a transient response and generates a response voltage RV according to the transient response when receiving the ESD charges. The transistor switch circuit 120 is triggered by the response voltage RV to activate, so as to generate a control voltage CV according to the ESD charges. The ESD protection device 130 turns on according to the control voltage CV. At the moment that the ESD protection device 130 turns on according to the control voltage CV, the ESD charges are discharged through the SCR equivalent circuit therein, such that the current corresponding to the ESD charges can flow through the SCR equivalent circuit in the ESD protection device 130 toward a place with a low-level voltage VSS.

Figure 2:
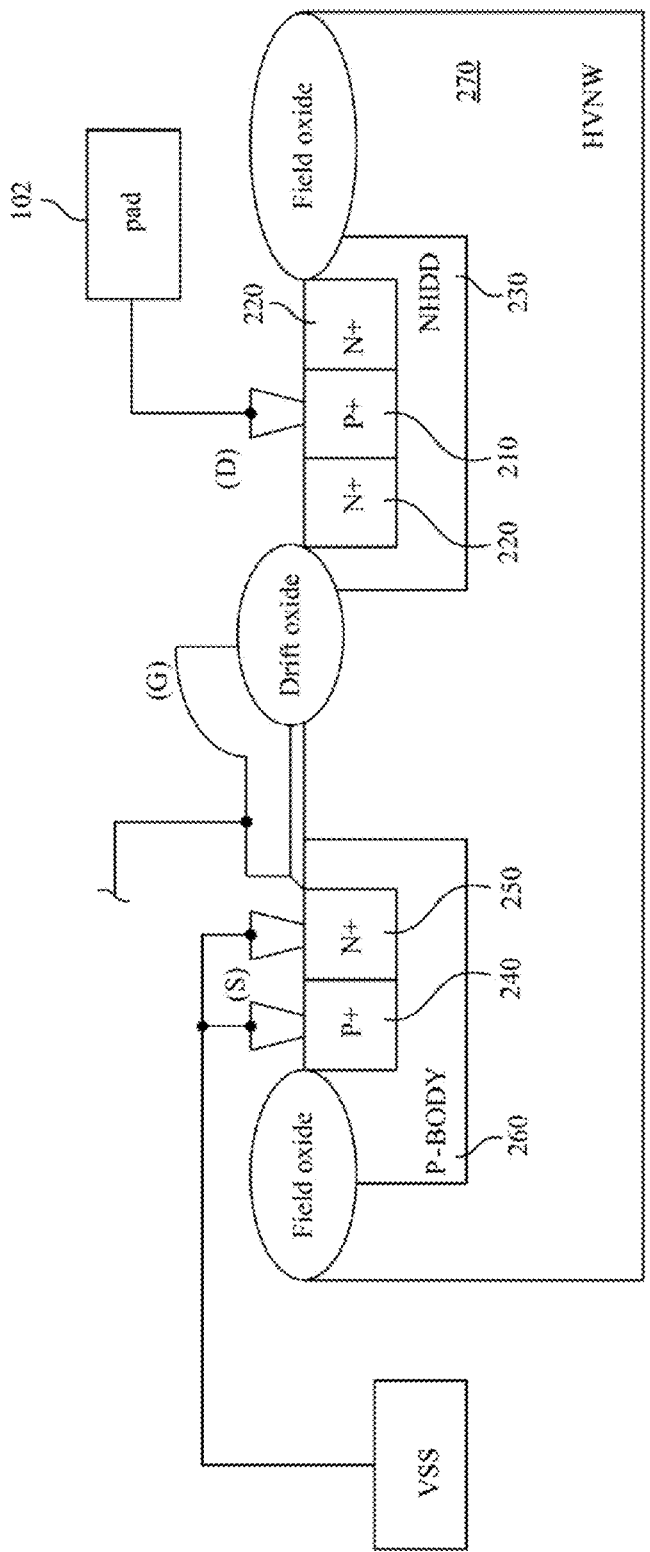
FIG. 2 is a structure diagram of the ESD protection device shown in FIG. 1 in accordance with one embodiment of the present invention.

FIG. 2 is a structure diagram of the ESD protection device shown in FIG. 1 in accordance with one embodiment of the present invention. In the present embodiment, the ESD protection device is an N-type lateral diffusion metal-oxide-semiconductor field effect transistor (LDNMOS) 130a which includes a drain region (D), a source region (S) and a gate region (G), and the transistor 130a has the parasitical SCR equivalent circuit. The drain region (D) is disposed apart from the source region (S) with the gate region (G) in between the drain region (D) and the source region (S). The drain region (D) is coupled to the pad 102, the source region (S) is coupled to the low-level voltage VSS, the gate region (G) is coupled to the transistor switch circuit 120, and the SCR equivalent circuit parasitizes in between the drain region (D) and the source region (S).

More specifically, the transistor 130a can include the drain region (D) and the source region (S). The drain region (D) can include a P-type heavily doped region (P+) 210 and N-type heavily doped regions (N+) 220, in which the P-type heavily doped region 210 and the N-type heavily doped regions 220 can be formed in an N-type buffer region 230. The P-type heavily doped region 210 is coupled to the pad 102. Both of the N-type heavily doped regions 220 are adjacently coupled to both sides of the P-type heavily doped region 210, respectively, without being coupled to any terminal, and perform floated. In another embodiment, the drain region (D) of the transistor 130a only includes one N-type heavily doped region 220 adjacently coupled to the P-type heavily doped region 210, and this N-type heavily doped region 220 is also floated.

On the other hand, the source region (S) of the transistor 130a includes another N-type heavily doped region 250, in which the N-type heavily doped region 250 is coupled to the low-level voltage VSS such that the drain region (D) and the source region (S) can form a discharging circuit loop.

Furthermore, the transistor 130a can further include a P-type contact region 240 and a P-type semiconductor region. The P-type semiconductor region in the present embodiment can be a P-type body region 260. The P-type contact region 240 and the N-type heavily doped region 250 are formed in the P-type body region 260, and the P-type contact region 240 is coupled to the low-level voltage VSS, such that the P-type body region 260 can be coupled through the P-type contact region 240 to the low-level voltage VSS.

Moreover, the transistor 130a can further include an N-type well region 270, and the P-type body region 260 and the N-type buffer region 230 can be formed in the N-type well region 270.

As mentioned above, the four parts, i.e. the P-type heavily doped region 210, the N-type heavily doped region 220 together with the N-type buffer region 230 and the N-type well region 270, the P-type body region 260, and the N-type heavily doped region 250, can form the semiconductor interfaces of P/N/P/N, and the SCR equivalent circuit with the semiconductor interfaces of P/N/P/N can thus be formed, in which the P-type heavily doped region 210 can be used as an anode of the SCR equivalent circuit, and the N-type heavily doped region 250 can be used as a cathode of the SCR equivalent circuit.

Figure 3:
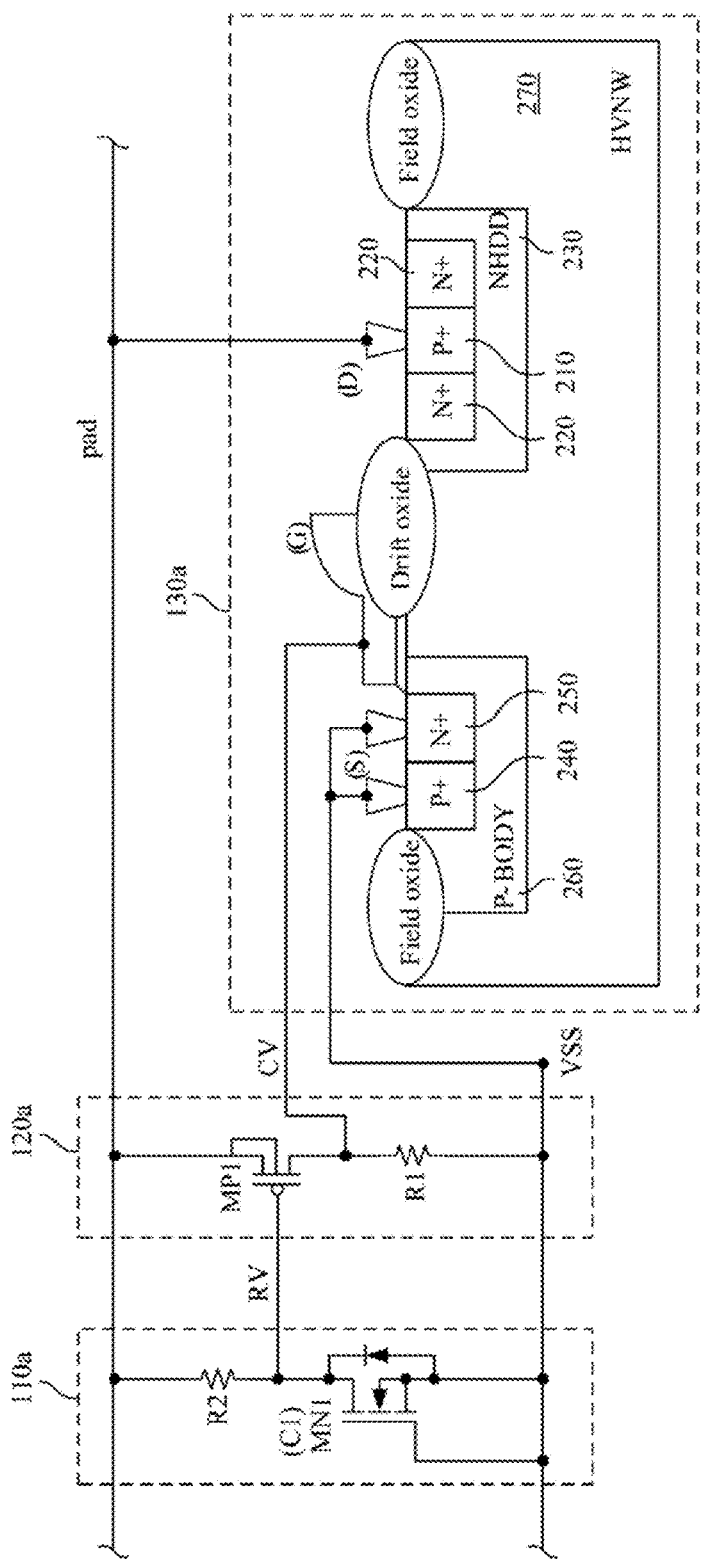
FIG. 3 is a structure diagram of the ESD protection apparatus shown in FIG. 1 in accordance with a first embodiment of the present invention.

FIG. 3 is a structure diagram of the ESD protection apparatus shown in FIG. 1 in accordance with a first embodiment of the present invention. The transistor 130a is previously mentioned. The transistor switch circuit 120a can include an equivalent resistor R1 and a transistor switch MP1. The equivalent resistor R1 is coupled between the gate (G) of the transistor 130a and the low-level voltage VSS. The transistor switch MP1 is coupled between the pad and the equivalent resistor R1 and capable of conducting currents between the pad and the equivalent resistor R1. When the transistor switch MP1 turns on, the equivalent resistor R1 can generate the control voltage CV at a coupling node between the equivalent resistor R1 and the transistor switch MP1 based on the ESD charges on the pad, so as to control the transistor 130a.

In the present embodiment, the transistor switch MP1 can be a PMOS transistor, in which the PMOS transistor has a source coupled to the pad and for receiving the ESD charges, a drain coupled to the equivalent resistor R1, and a gate coupled to the phase shift circuit 110a for receiving the response voltage RV.

In addition, the equivalent resistor R1 can be a poly-silicon resistor, a diffusion resistor, a well resistor, or carried out by a transistor.

In another aspect, the phase shift circuit 110a can include an equivalent resistor R2 and an equivalent capacitor C1, in which the equivalent resistor R2 is connected with the equivalent capacitor C1 in series. The equivalent resistor R2 is coupled between the pad and the control terminal of the transistor switch MP1. The equivalent capacitor C1 is coupled between the control terminal of the transistor switch MP1 and the low-level voltage VSS.

In the present embodiment, the equivalent capacitor C1 can be carried out by an NMOS transistor MN1, in which the transistor MN1 has a gate and a source both coupled to the low-level voltage VSS and has a drain coupled to the equivalent resistor R2 and the control terminal of the transistor switch MP1, and the sum of all parasitical capacitances in the transistor MN1 is the capacitance of the equivalent capacitor C1.

Moreover, the equivalent resistor R2 also can be a polysilicon resistor, a diffusion resistor, a well resistor, or carried out by a transistor.

In operation, when ESD charges occurs on the pad, one terminal of the equivalent resistor R2 receives the ESD charges, and the equivalent resistor R2 would interact with the equivalent capacitor C1 and generate the low-level response voltage RV at the connection of the equivalent capacitor C1 with the equivalent resistor R2 according to the transient response due to the interaction therebetween. Then, the transistor switch MP1 is triggered by the response voltage RV to turn on, such that the current corresponding to the ESD charges flows through the transistor switch MP1 to the equivalent resistor R1, and the high-level control voltage CV is thus generated at the connection of the transistor switch MP1 with the equivalent resistor R1. Afterwards, the gate (G) of the transistor 130a receives the control voltage CV, such that the transistor 130a turns on according to the control voltage CV. When the transistor 130a is turned on by the control voltage CV, the ESD charges can be discharged through the SCR equivalent circuit in the transistor 130a.

At the moment that the gate (G) of the transistor 130a receives the control voltage CV, the semiconductor channel under the gate (G) is formed and produces a few of electron-hole pairs, in which the electron-hole pairs are produced so that the SCR equivalent circuit parasitized in the transistor 130a can turn on more easily.

In addition, because the N-type heavily doped region 220 is floated, the semiconductor interface between the P-type heavily doped region 210 and the N-type heavily doped region 220 inclines to have a forward bias. Thus, the SCR equivalent circuit with the semiconductor interfaces of P/N/P/N in the transistor 130a can turn on quickly due to the aforementioned skills, so as to effectively discharge the ESD charges and the corresponding large current.

Figure 4:
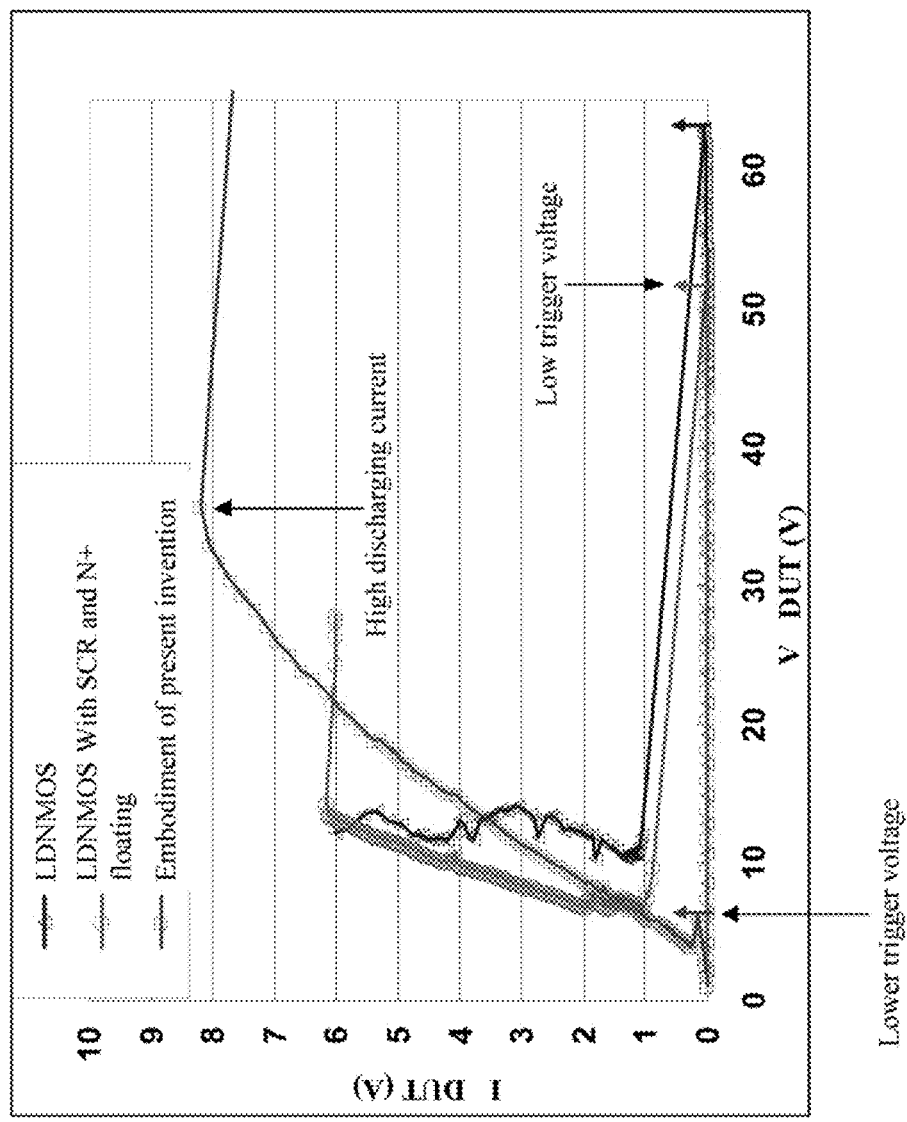
FIG. 4 is a comparison diagram of a prior N-type lateral diffusion metal-oxide-semiconductor field effect transistor (LDNMOS), the LDNMOS with the SCR equivalent circuit and the floating N-type heavily doped region in the embodiment of the present invention, and the embodiment as shown in FIG. 3, after tested by a transmission line pulse (TLP) generator.

FIG. 4 is a comparison diagram of a prior N-type lateral diffusion metal-oxide-semiconductor field effect transistor (LDNMOS), the LDNMOS with the SCR equivalent circuit and the floating N-type heavily doped region in the embodiment of the present invention, and the embodiment as shown in FIG. 3, after tested by a transmission line pulse (TLP) generator. Table I shows the TLP test data in FIG. 4, the comparison of HBM (human body mode) data not shown in FIG. 4, and another group of data for a prior LDNMOS with the SCR equivalent circuit (N-type heavily doped region not floated) for comparison.

According to FIG. 4 and Table I, for the LDNMOS with the SCR equivalent circuit and the floating N-type heavily doped region in the embodiment of the present invention, its trigger voltage Vtr1 can be reduced to 51.4 V, which is lower than those in other two prior skills, and its discharging current can be increased to 6.01 A, which is higher than those in other two prior skills. According to the aforementioned embodiments, the trigger voltage Vtr1 can be effectively reduced by floating the N-type heavily doped region and the ESD ability can be enhanced as well at the same time. Moreover, except for the use of the LDNMOS with the SCR equivalent circuit and the floating N-type heavily doped region, if the circuit shown in FIG. 3 is further adopted, then the trigger voltage Vtr1 can be significantly reduced to 6.18V and the discharging current can be increased to 8.2 A, such that the ESD ability can be significantly enhanced.

In addition, since the ESD event may produce positive ESD charges or negative ESD charges such that a large amount of currents (positive or negative), which may be generated from many kinds of sources (e.g. human body or machine), flow to the electric apparatus in a short and continuous time, Table I further shows the HBM test results of the foregoing four devices under the positive electrostatic charge mode and the negative electrostatic charge mode. According to the Table I, under the positive electrostatic charge mode, for the LDNMOS with the SCR equivalent circuit and the floating N-type heavily doped region in the embodiments of the present invention, its HBM test result can increase to 8 KV, and for the ESD protection apparatus shown in FIG. 3, its HBM test result can increase to 6.75-7.25 KV. On the other hand, under the negative electrostatic charge mode, the HBM test results show that the embodiments of the present invention have the same effects as those of the other two prior skills.

In another aspect, the following Table II shows the transient induced latch-up (TLU) test results of the prior N-type lateral diffusion metal-oxide-semiconductor field effect transistor (LDNMOS), the prior LDNMOS with the SCR equivalent circuit, the LDNMOS with the SCR equivalent circuit and the floating N-type heavily doped region in the embodiment of the present invention, and the embodiment as shown in FIG. 3, using the machine model (MM) under the positive electrostatic charge mode and the negative electrostatic charge mode. From Table II, it is known that the embodiment of the present invention has approximately the same effects as those of the other prior ESD apparatuses under the machine model.

TABLE I

|  | LDNMOS | LDNMOS with SCR | LDNMOS with SCR and floating N+ region | embodiment in FIG. 3 |
|---|---|---|---|---|
| BVDSS (V) | 47.5 | 48 | 47.6 | 48 |
| Vtr1 (V) | 62.9 | 63.8 | 51.4 | 6.18 |
| Itr1 (A) | 0.0456 | 0.0463 | 0.0144 | 0.15 |
| Vt2 (V) | 12.4 | 15.2 | 28.5 | 35.7 |
| It2 (A) | 5.81 | 3.7 | 6.01 | 8.2 |
| HBM test (positive electrostatic charge (KV)) | | | | |
| 1st sample | 4.75 | 4 | 8 | 7 |
| 2nd sample | 3.25 | 4 | 8 | 6.75 |
| 3rd sample | 4 | 3.25 | 8 | 6.75 |
| 4th sample | 3 | 3 | 8 | 7.25 |
| 5th sample | 4 | 2.75 | 8 | 7.25 |
| (Average) | 3.8 | 3.4 | 8 | 7 |
| HBM test (negative electrostatic charge (KV)) | | | | |
| 1st sample | 8 | 8 | 8 | 8 |
| 2nd sample | 8 | 8 | 8 | 8 |
| 3rd sample | 8 | 8 | 8 | 8 |
| (Average) | 8 | 8 | 8 | 8 |

TABLE II

|  | LDNMOS | LDNMOS with SCR | LDNMOS with SCR and floating N+ | embodiment of the present invention |
|---|---|---|---|---|
| positive electrostatic charge (V) TLU (MM) | 100 | 100 | 90 | 110 |
| negative electrostatic charge (V) TLU (MM) | −30 | −40 | −10 | −20 |

Figure 5:
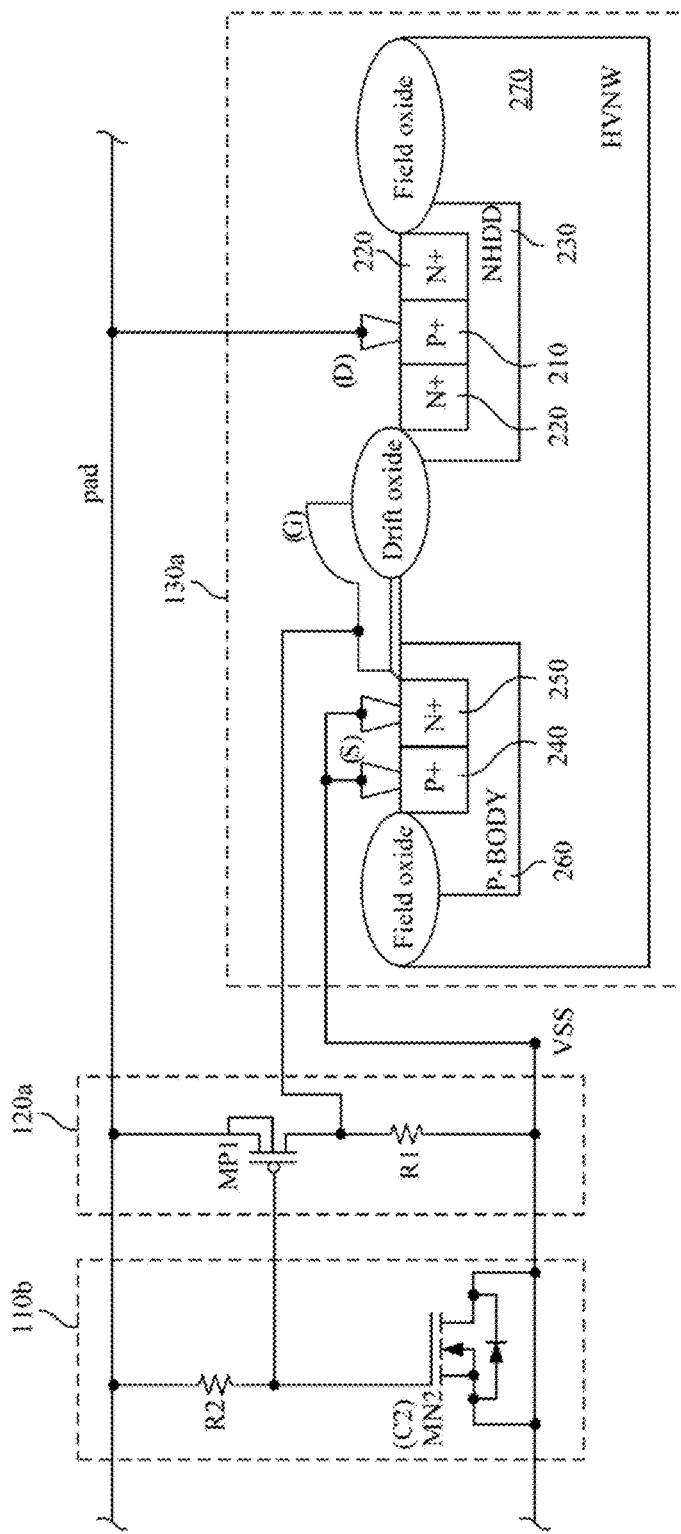
FIG. 5 is a structure diagram of the ESD protection apparatus shown in FIG. 1 in accordance with a second embodiment of the present invention.

FIG. 5 is a structure diagram of the ESD protection apparatus shown in FIG. 1 in accordance with a second embodiment of the present invention. Compared to FIG. 3, the phase shift circuit 110b includes the equivalent resistor R2 and the equivalent capacitor C2, in which the equivalent resistor R2 is connected with the equivalent capacitor C2 in series. The equivalent resistor R2 can be coupled between the pad and the control terminal of the transistor switch MP1. The equivalent capacitor C2 can be coupled between the control terminal of the transistor switch MP1 and the low-level voltage VSS.

In the present embodiment, the equivalent capacitor C2 can be carried out by an NMOS transistor MN2, which has a gate coupled to the equivalent resistor R2 and the control terminal of the transistor switch MP1 and has a drain and a source coupled to the low-level voltage VSS. The sum of all parasitical capacitances in the transistor MN2 is the capacitance of the equivalent capacitor C2.

Figure 6:
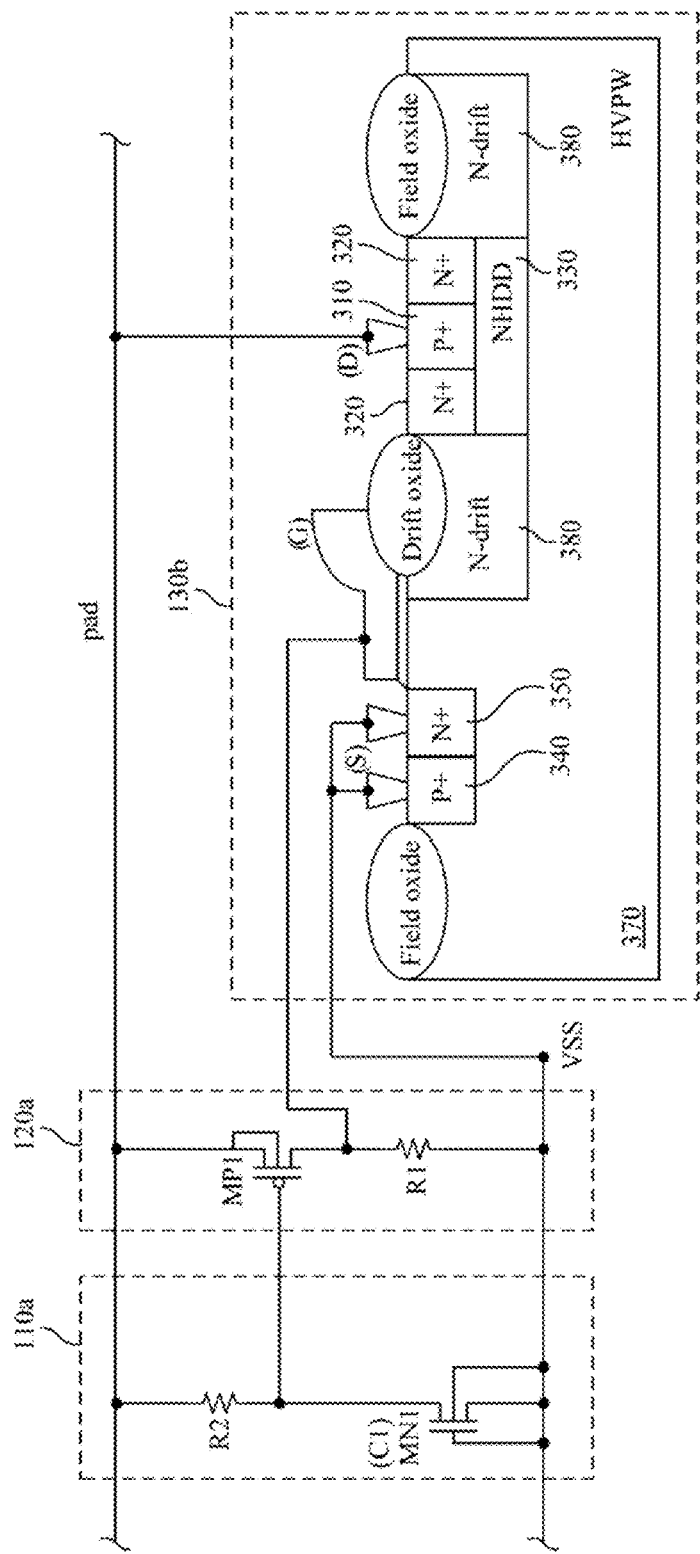
FIG. 6 is a structure diagram of the ESD protection apparatus shown in FIG. 1 in accordance with a third embodiment of the present invention.

FIG. 6 is a structure diagram of the ESD protection apparatus shown in FIG. 1 in accordance with a third embodiment of the present invention. Compared to FIG. 3, the ESD device in the present embodiment is an N-type high voltage metal-oxide-semiconductor field effect transistor (HVNMOS) which includes the same drain region (D), source region (S) and gate region (G). In the present embodiment, the P-type semiconductor region can be a P-type well 370, and the source region (S), the N-type drift diffusion regions 380 and the N-type buffer region 330 are all formed in the P-type well 370. The drain region (D) can include the P-type heavily doped region 310 and the N-type heavily doped regions 320, in which the P-type heavily doped region 310 and the N-type heavily doped regions 320 can be formed in the N-type buffer region 330.

The P-type heavily doped region 310 can be coupled to the pad. The N-type heavily doped regions 320 are adjacently coupled to both sides of the P-type heavily doped region 310, respectively, without being coupled to any terminal, and perform floated. The N-type drift diffusion regions 380 are adjacently coupled to both sides of the N-type buffer region 330. In another embodiment, the drain region (D) of the transistor 130b only includes one N-type heavily doped region 320 adjacently coupled to the P-type heavily doped region 310, and the N-type heavily doped region 320 is also floated.

In another aspect, the source region (S) of the transistor 130b can include the N-type heavily doped region 350, in which the N-type heavily doped region 350 is coupled to the low-level voltage VSS such that the drain region (D) and the source region (S) can form a discharging circuit loop.

In addition, the transistor 130b can further include the P-type contact region 340, in which the P-type contact region 340 and the N-type heavily doped region 350 are formed in the P-type well 370, and the P-type contact region 340 is coupled to the low-level voltage VSS.

Figure 7:
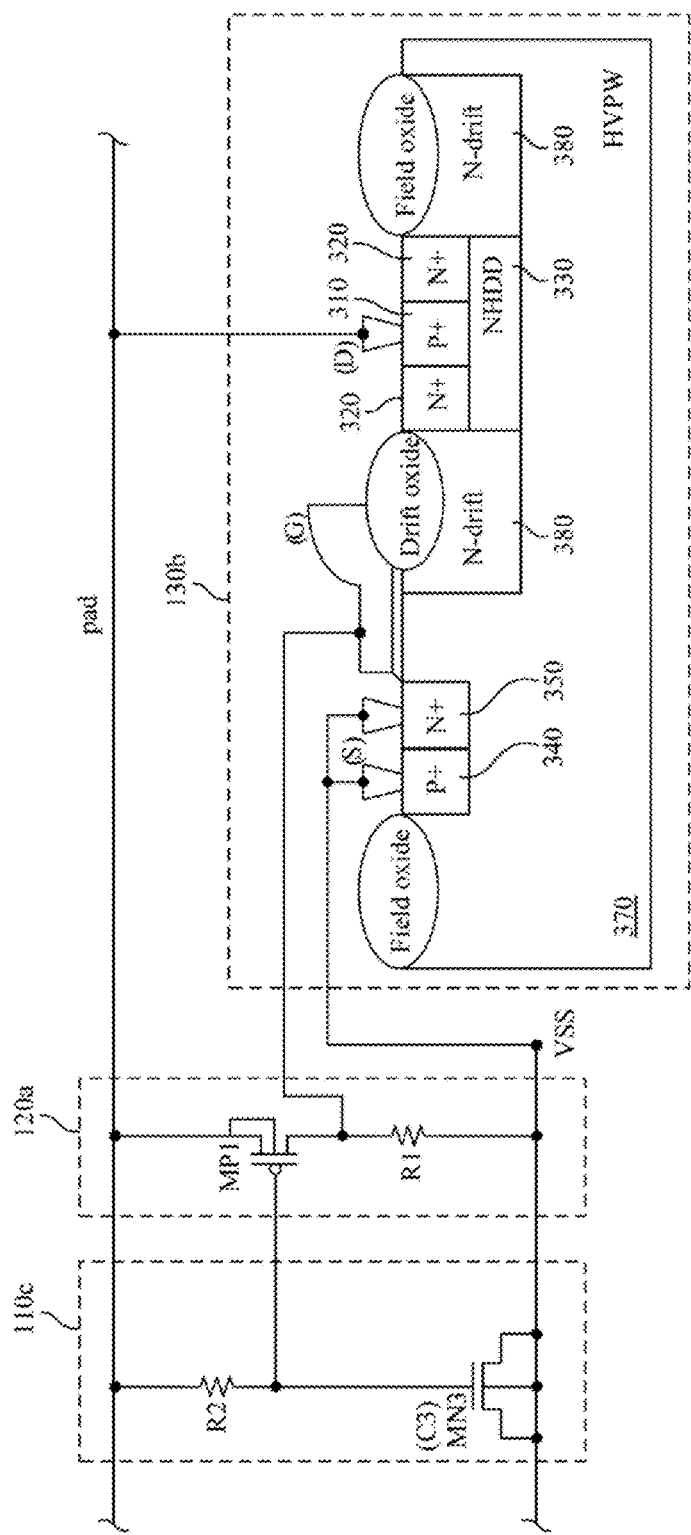
FIG. 7 is a structure diagram of the ESD protection apparatus shown in FIG. 1 in accordance with a fourth embodiment of the present invention.

FIG. 7 is a structure diagram of the ESD protection apparatus shown in FIG. 1 in accordance with a fourth embodiment of the present invention. Compared to FIG. 6, the phase shift circuit 110c includes the equivalent resistor R2 and the equivalent capacitor C3, in which the equivalent resistor R2 is connected with the equivalent capacitor C3 in series. The equivalent resistor R2 is coupled between the pad and the control terminal of the transistor switch MP1. The equivalent capacitor C3 is coupled between the control terminal of the transistor switch MP1 and the low-level voltage VSS.

In the present embodiment, the equivalent capacitor C3 can be carried out by an NMOS transistor MN3, which has a gate coupled to the equivalent resistor R2 and the control terminal of the transistor switch MP1 and has a drain and a source coupled to the low-level voltage VSS. The sum of all parasitical capacitances in the transistor MN3 is the capacitance of the equivalent capacitor C3.

For the foregoing embodiments, the ESD protection apparatus can be applied not only to reduce the trigger voltage necessary when the ESD protection mechanism is activated, but also to enhance the ability of conducting a large ESD current, such that the ESD protection apparatus performs more effectively.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. An electrostatic discharge (ESD) protection apparatus comprising:
    a first metal-oxide-semiconductor field effect transistor (MOSFET) coupled between a pad and a low-level voltage, the first MOSFET having a parasitical silicon controlled rectifier (SCR) equivalent circuit parasitizing in the first MOSFET, the first MOSFET comprising:
        a P-type heavily doped region, the first MOSFET being coupled through the P-type heavily doped region to the pad, the P-type heavily doped region being an anode of the SCR equivalent circuit; and
        at least one N-type heavily doped region being adjacent to the P-type heavily doped region, wherein the at least one N-type heavily doped region is floated;
    a first equivalent resistor coupled between a gate of the first MOSFET and the low-level voltage;
    a transistor switch coupled between the pad and the first equivalent resistor and configured to conduct currents between the pad and the first equivalent resistor;
    a second equivalent resistor coupled between the pad and a control terminal of the transistor switch;
    an equivalent capacitor coupled between the control terminal of the transistor switch and the low-level voltage;
    an N-type buffer region, the P-type heavily doped region and the at least one N-type heavily doped region being formed in the N-type buffer region;
    a P-type body region; and
    an N-type well region, the P-type body region and the N-type buffer region being formed in the N-type well region;
    wherein when electrostatic discharge charges occurs on the pad, the transistor switch conducts currents between the pad and the first equivalent resistor, such that the first MOSFET turns on and the electrostatic discharge charges are discharged through the SCR equivalent circuit.

2. The ESD protection apparatus as claimed in claim 1, wherein the first equivalent resistor is a transistor.

3. The ESD protection apparatus as claimed in claim 1, wherein the transistor switch is a P-type transistor, a source of the P-type transistor being coupled to the pad, a drain of the P-type transistor being coupled to the first equivalent resistor and a gate of the first MOSFET.

4. The ESD protection apparatus as claimed in claim 3, wherein the equivalent capacitor is a second MOSFET, a gate and a source of the second MOSFET being coupled to the low-level voltage, a drain of the second MOSFET being coupled to a gate of the P-type transistor.

5. The ESD protection apparatus as claimed in claim 1, wherein the equivalent capacitor is a second MOSFET, a drain and a source of the second MOSFET being coupled to the low-level voltage, a gate of the second MOSFET being coupled to a gate of the P-type transistor.

6. The ESD protection apparatus as claimed in claim 1, wherein when the electrostatic discharge charges occurs on the pad, the second equivalent resistor operates with the equivalent capacitor in accordance with a transient response to turn on the first MOSFET.

7. The ESD protection apparatus as claimed in claim 1, wherein the first MOSFET is a lateral diffusion MOSFET or a high voltage MOSFET.

8. The ESD protection apparatus as claimed in claim 1, wherein the first MOSFET comprises:
 two of the N-type heavily doped regions being separately adjacent to the P-type heavily doped region, wherein the N-type heavily doped regions are floated.

9. An electrostatic discharge (ESD) protection apparatus comprising:
 a phase shift circuit having a transient response and generating a response voltage according to the transient response when receiving electrostatic discharge charges;
 a transistor switch circuit triggered by the response voltage to turn on and generate a control voltage based on the electrostatic discharge charges; and
 a first metal-oxide-semiconductor field effect transistor (MOSFET) turning on according to the control voltage;
 a parasitical silicon controlled rectifier (SCR) equivalent circuit parasitizing in the first MOSFET, wherein the electrostatic discharge charges are discharged through the SCR equivalent circuit when the first MOSFET is turned on by the control voltage;
 wherein the first MOSFET further comprises:
  a P-type heavily doped region configured to couple to a pad and to be an anode of the SCR equivalent circuit; and
  at least one N-type heavily doped region being adjacent to the P-type heavily doped region, wherein the at least one N-type heavily doped region is floated;
 an N-type buffer region, the P-type heavily doped region and the at least one N-type heavily doped region being formed in the N-type buffer region;
 a P-type body region; and
 an N-type well region, the P-type body region and the N-type buffer region being formed in the N-type well region.

10. The ESD protection apparatus as claimed in claim 9, wherein the phase shift circuit further comprises:
 an equivalent resistor having one terminal for receiving the electrostatic discharge charges; and
 an equivalent capacitor connected with the equivalent resistor in series, wherein the response voltage is generated at the connection of the equivalent capacitor with the equivalent resistor.

11. The ESD protection apparatus as claimed in claim 10, wherein the equivalent capacitor is a second MOSFET, and the second MOSFET has a gate and a source both coupled to a low-level voltage and has a drain connected with the equivalent resistor.

12. The ESD protection apparatus as claimed in claim 10, wherein the equivalent capacitor is a second MOSFET, and the second MOSFET has a gate connected with the equivalent resistor and has a drain and a source both coupled to a low-level voltage.

13. The ESD protection apparatus as claimed in claim 9, wherein the transistor switch circuit further comprises:
 a transistor switch for receiving the response voltage and triggered by the response voltage to turn on; and
 an equivalent resistor coupled to the transistor switch and generating the control voltage at a coupling node between the equivalent resistor and the transistor switch based on the electrostatic discharge charges when the transistor switch turns on.

14. The ESD protection apparatus as claimed in claim 13, wherein the transistor switch is a P-type transistor having a gate for receiving the response voltage, a source for receiving the electrostatic discharge charges, and a drain coupled to the equivalent resistor.

15. The ESD protection apparatus as claimed in claim 9, wherein the first MOSFET comprises:
 two of the N-type heavily doped regions being separately adjacent to the P-type heavily doped region, wherein the N-type heavily doped regions are floated.

* * * * *